(12) United States Patent
Beica et al.

(10) Patent No.: US 7,151,049 B2
(45) Date of Patent: Dec. 19, 2006

(54) ELECTROPLATING COMPOSITIONS AND METHODS

(75) Inventors: Rozalia Beica, Bayport, NY (US); Neil D. Brown, Merrick, NY (US); Kai Wang, West Hempstead, NY (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 218 days.

(21) Appl. No.: 10/816,627

(22) Filed: Apr. 2, 2004

(65) Prior Publication Data
US 2004/0253804 A1 Dec. 16, 2004

Related U.S. Application Data

(60) Provisional application No. 60/460,937, filed on Apr. 7, 2003.

(51) Int. Cl.
*H01L 21/44* (2006.01)
*C25D 7/12* (2006.01)

(52) U.S. Cl. ............... 438/612; 438/613; 438/614; 205/157; 205/241; 205/300; 257/E21.002

(58) Field of Classification Search ............. 438/612, 438/613, 614; 205/157, 241, 300
See application file for complete search history.

(56) References Cited

U.S. PATENT DOCUMENTS

| | | | |
|---|---|---|---|
| 4,440,608 A | 4/1984 | Opaskar et al. | |
| 4,532,186 A | 7/1985 | Shibagaki et al. | |
| 4,686,017 A | 8/1987 | Young | |
| 4,755,265 A | 7/1988 | Young | |
| 5,378,347 A | 1/1995 | Thomson et al. | |
| 5,646,068 A | 7/1997 | Wilson et al. | |
| 5,854,514 A | 12/1998 | Roldan et al. | |
| 5,911,866 A | 6/1999 | Oshima et al. | |
| 5,990,564 A | 11/1999 | Degani et al. | |
| 6,005,292 A | 12/1999 | Roldan et al. | |
| 6,013,572 A | 1/2000 | Hur et al. | |
| 6,099,713 A | 8/2000 | Yanada et al. | |
| 6,107,180 A | 8/2000 | Munroe et al. | |
| 6,127,253 A | 10/2000 | Roldan et al. | |
| 6,176,996 B1 | 1/2001 | Moon | |
| 6,224,690 B1 | 5/2001 | Andricacos et al. | |
| 6,436,269 B1 | 8/2002 | Opaskar et al. | |
| 6,436,730 B1 | 8/2002 | Melton et al. | |
| 6,458,264 B1 | 10/2002 | Muramatsu et al. | |
| 6,476,494 B1 | 11/2002 | Hur et al. | |
| 6,508,927 B1 | 1/2003 | Yanada et al. | |

(Continued)

FOREIGN PATENT DOCUMENTS

EP 1 001 054 5/2000

(Continued)

OTHER PUBLICATIONS

Karim et al.; "Lead-Free Solder Bump Technologies for Flip-Chip Packaging Applications"; 2001 Intenational Symposium on Microelectronics; pp. 581-583.

(Continued)

*Primary Examiner*—Zandra V. Smith
*Assistant Examiner*—Christy Novacek
(74) *Attorney, Agent, or Firm*—John J. Piskorski

(57) ABSTRACT

Disclosed are electrolyte compositions for depositing a tin alloy on a substrate. The electrolyte compositions include tin ions, ions of one or more alloying metals, an acid, a thiourea derivative, and an additive selected from alkanol amines, polyethylene imines, alkoxylated aromatic alcohols, and combinations thereof. Also disclosed are methods of depositing a tin alloy on a substrate and methods of forming an interconnect bump on a semiconductor device.

17 Claims, 12 Drawing Sheets

U.S. PATENT DOCUMENTS

| | | |
|---|---|---|
| 6,527,840 B1 | 3/2003 | Igarashi et al. |
| 6,579,591 B1 | 6/2003 | Bishop et al. |
| 6,607,653 B1 | 8/2003 | Tsuji et al. |
| 6,666,369 B1 * | 12/2003 | Matsuki et al. ............. 228/199 |
| 6,706,418 B1 * | 3/2004 | Egli et al. ................... 428/647 |
| 6,921,716 B1 | 7/2005 | Huang et al. |
| 2002/0093096 A1 | 7/2002 | Tago et al. |
| 2002/0127847 A1 | 9/2002 | Alling et al. |
| 2003/0024822 A1 | 2/2003 | Steinius et al. |
| 2003/0226758 A1 * | 12/2003 | Egli .......................... 205/252 |
| 2004/0067604 A1 | 4/2004 | Ouellet et al. |
| 2005/0106408 A1 | 5/2005 | Chen et al. |
| 2005/0123784 A1 | 6/2005 | Miura |
| 2005/0158980 A1 | 7/2005 | Seshan |
| 2005/0176231 A1 | 8/2005 | Shei et al. |
| 2005/0176234 A1 | 8/2005 | Shei et al. |
| 2005/0260430 A1 | 11/2005 | Kuroda et al. |

FOREIGN PATENT DOCUMENTS

| | | |
|---|---|---|
| EP | 0 854 206 | 8/2001 |
| JP | 9-143786 | 6/1997 |
| WO | WO 01/02627 | 1/2001 |

OTHER PUBLICATIONS

Patent Abstracts of Japan, vol. 2000, No. 23; Feb. 10, 2001 & JP 2001 164396 A (Ishihara Chem. Co. Ltd.; Daiwa Kasei Kenkyusho: KK).

* cited by examiner

ELECTROPLATING COMPOSITIONS AND METHODS

CROSS-REFERENCE TO RELATED APPLICATIONS

This application claims the benefit under 35 U.S.C. § 119(e) of U.S. Provisional Application No. 60/460,937, filed Apr. 7, 2003, the entire contents of which are incorporated herein by reference.

BACKGROUND OF THE INVENTION

This invention relates generally to the field of metal alloys useful for metal plating. In particular, the present invention relates to electrolyte compositions for depositing a tin alloy on a substrate and to methods of depositing a tin alloy on a substrate. The invention further relates to methods of forming interconnect bumps on a semiconductor device. Particular applicability can be found in semiconductor device packaging in the formation of interconnect bumps on semiconductor devices.

Tin and tin-lead alloy deposits are useful for the electronics industry, particularly in the manufacture of printed wiring boards, electrical contacts and connectors, semiconductors, electrical conduit and other related parts where the inherent properties of these deposits are necessary. Of the various electronic applications, there is a current focus in the semiconductor manufacturing industry on wafer-level-packaging (WLP). With wafer-level-packaging, IC interconnects are fabricated en masse on the wafer, and complete IC modules can be built on the wafer before it is diced. Benefits gained using WLP include, for example, increased I/O density, improved operating speeds, enhanced power density and thermal management, and decreased package size.

One of the keys to WLP is the build up of flip-chip conductive interconnect bumps on the wafer. These interconnect bumps serve as electrical and physical connections of the semiconductor components to a printed wiring board. Several methods of forming interconnect bumps on semiconductor devices have been proposed, for example, solder plate bumping, evaporation bumping, conductive adhesive bonding, stencil printing solder bumping, stud bumping, and ball placement bumping. Of these techniques, it is believed that the most cost effective technique for forming fine pitch arrays is solder plate bumping, which involves a combination of a temporary photoresist plating mask and electroplating. This technique is being rapidly adopted as full-area interconnect bump technology for high value-added assemblies such as microprocessors, digital signal processors, and application specific integrated circuits.

Electroplating methods for depositing tin, tin-lead and other tin-containing alloys are well known and many electrolytes have been proposed for electroplating such metals and/or alloys. For example, U.S. Pat. No. 4,880,507 to Toben et al. discloses electrolytes, systems and processes for depositing tin, lead or a tin-lead alloy. The electronics industry has recently been in search of alternatives to tin-lead in light of the toxic properties of lead and the resulting current worldwide activities to ban its use. Suitable replacements for tin-lead alloys should possess the same or sufficiently similar properties to the tin-lead for a given application. Once a suitable replacement material has been found, development of an electroplating process capable of depositing such material to impart the desired properties can be a challenge.

It is desired that the composition of the deposits be effectively controlled to prevent melting of the material at too high or too low a temperature for a given application. Poor compositional control can result in either a temperature too high for the components being treated to withstand or, on the other extreme, incomplete formation of the solder joint.

Difficulties associated with co-deposition of lead-free tin alloys by electroplating arise when the materials being deposited have significantly different deposition potentials. Complications can arise, for example, when attempting to deposit alloys of tin (−0.137 V) with copper (0.34 V) or silver (0.799 V). To allow for co-deposition of such materials, the use of electrolytes that include cyanide compounds has been proposed. For example, Soviet Union Patent Application 377 435 A discloses a copper-tin alloy that is electrolytically deposited from a bath containing copper (I) cyanide, potassium cyanide, sodium stannate, sodium hydroxide and 3-methylbutanol. This electrolyte composition, however, has a very high cyanide concentration, making general handling as well as waste treatment hazardous.

Alternatives to co-deposition of such tin alloys by electroplating are known. For example, U.S. Pat. No. 6,476,494 to Hur et al discloses formation of silver-tin alloy solder bumps by electroplating silver on exposed portions of under-bump metallurgy, plating tin on the silver, and reflowing the structure to form silver-tin alloy solder bumps. Composition of the silver-tin alloy is difficult to precisely control in this process, as it depends on a number of variables which themselves must be accurately controlled. For example, the amount of silver that diffuses into the tin and thus silver concentration is a function of reflow temperature, reflow time, silver and tin layer thicknesses, as well as other parameters. Another proposed alternative to co-deposition of tin alloys involves tin electroplating followed by exchange plating of the alloying metal and a reflow process. Such a method typically requires a significant process time, and precise control of the alloy concentration can be difficult.

There is thus a continuing need in the art for electroplating compositions for depositing tin alloys on a substrate, which are substantially free of lead and cyanides, and form alloys having good mechanical properties, are easily solderable, and can be electrolytically co-deposited. There further is a need for such electroplating compositions that can be used for the formation of interconnect bumps on a semiconductor device for wafer-level-packaging purposes.

SUMMARY OF THE INVENTION

Through the present invention, it has been found that substantially lead- and cyanide-free tin alloys can be successfully plated using the electrolyte compositions of the present invention. The electrolyte compositions allow for co-deposition of tin with one or more alloying metals even where the metals have significantly different deposition potentials. The compositions find particular use in wafer-level-packaging in the formation of interconnect bumps on a semiconductor device.

In accordance with a first aspect, the present invention provides an electrolyte composition for depositing a tin alloy on a substrate. The electrolyte composition includes tin ions, ions of one or more alloying metals, an acid, a thiourea derivative, and an additive selected from alkanol amines, polyethylene imines, alkoxylated aromatic alcohols, and combinations thereof.

In accordance with a second aspect, the present invention provides a method of depositing a tin alloy on a substrate. The method involves contacting the substrate with an electrolyte composition that includes tin ions, ions of one or more alloying metals, an acid, a thiourea derivative, and an additive selected from alkanol amines, polyethylene imines, alkoxylated aromatic alcohols, and combinations thereof. A current is passed through the electrolyte composition to deposit the tin alloy on the substrate.

In accordance with a third aspect, the present invention provides a method of forming an interconnect bump on a semiconductor device. The method involves (a) providing a semiconductor die having a plurality of interconnect bump pads; (b) forming a seed layer over the interconnect bump pads; (c) depositing a tin-alloy interconnect bump layer over the interconnect bump pads by contacting the semiconductor die with an electrolyte composition that includes tin ions, ions of one or more alloying metals, an acid, a thiourea derivative, and an additive selected from alkanol amines, polyethylene imines, alkoxylated aromatic alcohols, and combinations thereof, and passing a current through the electrolyte composition to deposit the tin alloy interconnect bump layer on the substrate; and (d) reflowing the interconnect bump layer.

BRIEF DESCRIPTION OF THE DRAWINGS

The present invention will be discussed with reference to the following drawings, in which like reference numerals denote like features, and in which.

DETAILED DESCRIPTION OF THE INVENTION

Figure 1:
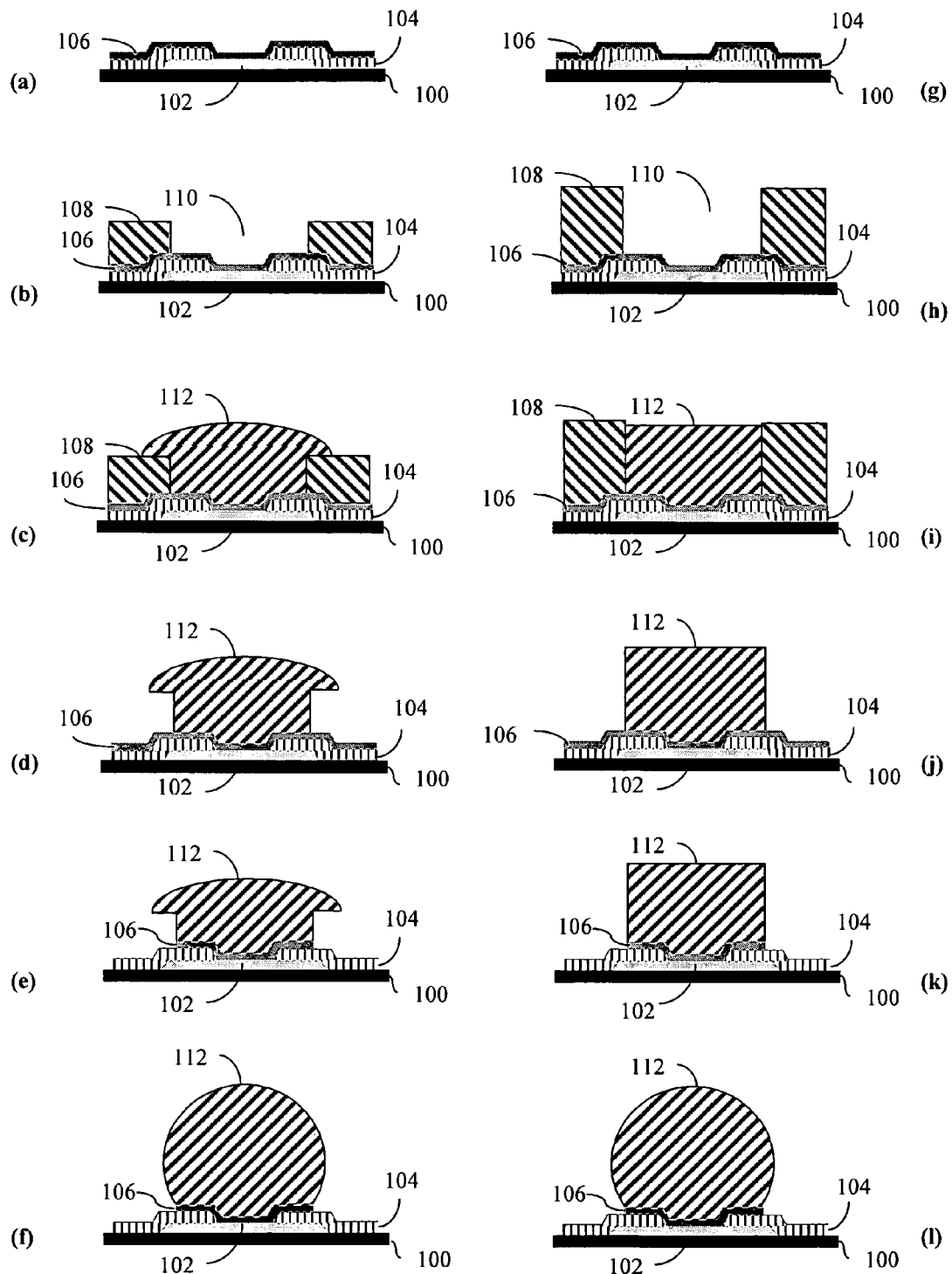
FIG. 1(a)–(l) illustrates in cross-section an interconnect bump on a semiconductor device at various stages of formation thereof, in accordance with the invention.

As used throughout this specification, the following abbreviations shall have the following meanings, unless the context clearly indicates otherwise: ° C.=degrees Centigrade; g=gram; mL=milliliter; L=liter; wt %=percent by weight; and A/dm$^2$ and ASD=amps per square decimeter. Deposition potentials are provided with respect to a hydrogen reference electrode. Relating to the electroplating process, the terms "depositing", "coating", "electroplating" and "plating" are used interchangeably throughout this specification. "Halide" refers to fluoride, chloride, bromide and iodide. All percentages are by weight, unless otherwise noted. All numerical ranges are inclusive.

The electrolyte compositions of the present invention include tin ions, ions of one or more alloying metal, an acid, a thiourea derivative, and an additive selected from alkanol amines, polyethylene imines, alkoxylated aromatic alcohols, and combinations thereof.

The electrolyte compositions and tin alloys of the present invention are preferably substantially free of lead, and more preferably free of lead. By "substantially free of lead" is meant that the electrolyte composition and the tin-alloy of the present invention contain less than about 50 ppm of lead. The electrolyte compositions of the present invention are typically free of cyanide.

The tin ions in the electrolyte compositions of the present invention may result from the addition of any solution soluble tin compound to the electrolyte. Suitable solution soluble tin compounds include, but are not limited to salts, such as tin halides, tin sulfates, tin alkane sulfonate, tin alkanol sulfonate, and the like, and acids. When tin halide is used, it is typical that the halide is chloride. The tin compound is typically tin sulfate, tin chloride or tin alkane sulfonate, and more typically tin sulfate or tin methane sulfonate. The tin compounds useful in the present invention are generally commercially available or may be prepared by methods known in the literature. Mixtures of solution soluble tin compounds may also be used in the present invention.

The amount of tin compound useful in the electrolyte compositions of the present invention will depend on the desired composition of the film to be deposited and operating conditions. Typically, this is an amount that provides a tin ion content in the range of 5 to 100 g/L, more typically 5 to 80 g/L and even more typically 10 to 70 g/L.

The one or more alloying metal ions useful in the present invention are those useful in forming binary, ternary and higher order alloys with tin including, but not limited to, silver, copper, bismuth, zinc, indium, antimony, and combinations thereof, for example, tin-silver-copper, tin-silver-bismuth, etc. The alloying metal ions useful in the present invention may result from the addition of any solution soluble metal compound or mixture of solution soluble metal compounds of the desired alloying metal(s). Suitable alloying-metal compounds include, but are not limited to metal halides, metal sulfates, metal alkane sulfonates, metal alkanol sulfonates, and the like, of the desired alloying metal. When a metal halide is used, it is typical that the halide is chloride. It is typical that the metal compound is a metal sulfate, a metal alkane sulfonate or a mixture thereof, and more typically a metal sulfate, a metal methane sulfonate or a mixture thereof. The metal compounds useful in the present invention are generally commercially available or may be prepared by methods described in the literature.

The amount of the one or more alloying metal compound useful in the electrolyte compositions of the present invention will depend, for example, on the desired composition of the film to be deposited and operating conditions. Typically, the amount will provide an alloying metal ion content in the electrolyte composition in the range of 0.01 to 10 g/L, and more specifically 0.02 to 5 g/L.

Any acid that is solution soluble and does not otherwise adversely affect the electrolyte composition may be used advantageously in the present invention. Suitable acids include, but are not limited to arylsulfonic acids, alkanesulfonic acids, such as methanesulfonic acid, ethanesulfonic acid and propanesulfonic acid, aryl sulfonic acids such as phenylsulfonic acid and tolylsulfonic acid, and mineral acids such as sulfuric acid, sulfamic acid, hydrochloric acid, hydrobromic acid and fluoroboric acid. Preferred acids are alkane sulfonic acids and aryl sulfonic acids. Although a mixture of acids may be used, it is typical that a single acid used. The acids useful in the present invention are generally commercially available or may be prepared by methods known in the literature.

While depending on the desired alloy composition and operating conditions, the amount of acid in the electrolyte compositions is typically in the range of 0.01 to 500 g/L, more typically 10 to 400 g/L, and still more typically 100 to 300 g/L. When the tin ions and/or ions of the one or more alloying metal in the composition are from a metal halide compound, use of the corresponding acid may be desired. For example, when one or more of tin chloride, silver chloride, copper chloride, or bismuth chloride are used, use of hydrochloric acid as the acid component may be desired. It will be appreciated by those skilled in the art that mixtures of acids may be used in the present invention.

It has been found that the use of one or more thiourea derivatives in the electrolyte compositions of the invention results in excellent elecroplating performance characteristics, and quite surprisingly improved performance over a broader current density range than thiourea itself. Thiourea derivatives have also been found to provide excellent antioxidant characteristics to the composition when compared with thiourea. Thiourea derivatives useful in the present electrolyte compositions include, for example, 1-allyl-2-thiourea, 1,1,3,3-tetramethyl-2-thiourea, thiourea 1,3-diethyl, thiourea 1,3-dimethyl, thiourea 1-methyl, thiourea 1-(3-tolyl), thiourea 1,1,3-trimethyl, thiourea 1-(2-tolyl), thiourea 1,3-di(2-tolyl), and combinations thereof. The amount of the thiourea derivative complexing agent in the compositions will depend, for example, on the amount of alloying metal and tin ions present in the composition. Typically, the thiourea derivative is present in an amount of from 0.01 to 50 g/L, more typically from 2 to 20 g/L.

The electrolyte compositions further include one or more additives selected from alkanol amines, polyethylene imines, alkoxylated aromatic alcohols, and combinations thereof. Combinations of two or more different additives within and/or among these groups can advantageously be used. Typically, the additive is present in an amount of from 0.01 to 50 g/L, more specifically from 2 to 20 g/L.

Suitable alkanol amines include, for example, substituted or unsubstituted methoxylated, ethoxylated, and propoxylated amines, for example, tetra (2-hydroxypropyl)ethylenediamine, 2-{[2-(Dimethylamino)Ethyl]-Methylamino}Ethanol, N,N'-Bis(2-Hydroxyethyl)-ethylenediamine, 2-(2-Aminoethylamine)-Ethanol, and combinations thereof.

Suitable polyethyleneimines include, for example, substituted or unsubstituted linear or branched chain polyethyleneimines or mixture thereof having a molecular weight of from 800–750,000. Suitable substituents include, for example, carboxyalkyl, for example, carboxymethyl, carboxyethyl.

Useful alkoxylated aromatic alcohols in the invention include, for example, ethoxylated bis phenol, ethoxylated beta naphthol, and ethoxylated nonyl phenol.

Optionally, one or more antioxidant compound can beneficially be employed in the electrolyte compositions to minimize or prevent stannous tin oxidation from occurring, for example, from the divalent to tetravalent state. Suitable antioxidant compounds are known to those skilled in the art and are disclosed, for example, in U.S. Pat. No. 5,378,347, to Thomson et al, the entire contents of which are incorporated herein by reference. The antioxidant compounds typically include, for example, multivalent compounds based on the elements of groups IV B, V B, and VI B in the Periodic Table of the Elements, such as those of vanadium, niobium, tantalum, titanium, zirconium and tungsten. Of these, multivalent vanadium compounds, such as vanadium whose valences are $5^+$, $4^+$, $3^+$, $2^+$, are preferred. Examples of useful vanadium compounds include vanadium (IV) acetyl acetonate, vanadium pentoxide, vanadium sulfate, and sodium vanadate. Typically, such antioxidant compounds when used in the electrolyte composition are present in an amount of from 0.01 to 10 g/L, more typically from 0.01 to 2 g/L.

A reducing agent may optionally be added to the electrolyte compositions of the present invention to assist in keeping the tin in a soluble, divalent state. Suitable reducing agents include, but are not limited to, hydroquinone and hydroxylated aromatic compounds, such as resorcinol, catechol, and the like. Typically, such reducing agents when used in the electrolyte composition are present in an amount of from 0.01 to 10 g/L, more typically from 0.1 to 5 g/L.

It will be appreciated by those skilled in the art that one or more other additives may be combined with the electrolyte composition of the present invention, such as wetting agents, brightening agents and the like. Mixtures of additives may also be used in the present invention.

For applications requiring good wetting capabilities, one or more wetting agents may be included in the electrolyte composition. Suitable wetting agents are known to those skilled in the art, and include any which yield deposits having good solderability, good matte or lustrous finish where desired, satisfactory grain refinement, and are stable in the acidic electroplating bath.

Bright deposits may be obtained by adding brighteners to the electrolyte compositions of the present invention. Such brighteners are well known to those skilled in the art. Suitable brighteners include, but are not limited to aromatic aldehydes, such as chlorobenzaldehyde, or derivatives thereof, such as benzal acetone. Suitable amounts for the brighteners are known to those skilled in the art.

It will be appreciated by those skilled in the art that other compounds may be added to the electrolyte compositions of the present invention to provide further grain refinement. Such other compounds may be added to the electrolyte composition of the present invention to further improve deposit appearance and operating current density range. Such other compounds include, but are not limited to:

alkoxylates, such as the polyethoxylated amines JEFFAMINE T-403 or TRITON RW, or sulfated alkyl ethoxylates, such as TRITON QS-15, and gelatin or gelatin derivatives. The amounts of such other compounds useful in the compositions of the present invention are well known to those skilled in the art and when present are typically are in the range of 0.1 to 20 mL/L, preferably 0.5 to 8 mL/L, and more preferably 1 to 5 mL/L.

Which optional additives, if any, are added to the electrolyte compositions of the present invention will depend upon the results and types of deposits desired.

It has been surprisingly found that the present electroplating baths provide tin alloys suitable for use in the manufacture of electronic devices, particularly for use in the formation of interconnect bumps on a semiconductor device in wafer-level-packaging.

Electroplating baths containing the electrolyte compositions of the present invention are typically prepared by adding to a vessel one or more of the acids, followed by one or more of the solution soluble tin compounds, one or more of the thiourea derivatives, one or more of the solution soluble alloying metal compounds, one or more of the alkanol amine, polyethylene imine, and/or alkoxylated aromatic alcohol additives, the one or more other optional additives, and the balance deionized water. Other orders of addition of the components of the compositions of the present invention may be used. Once the bath is prepared, undesired material can be removed, such as by filtration, and then water is typically added to adjust the final volume of the bath. The bath may be agitated by any known means, such as stirring, pumping, or recirculating, for increased plating speed.

The electrolyte compositions of the present invention and plating baths prepared therefrom typically are acidic, i.e. having a pH of less than 7, typically less than 1. An advantage of the electrolyte compositions of the present invention is that pH adjustment of the electroplating bath is not necessary.

The electrolyte compositions of the present invention are useful in any plating method where a tin alloy is desired. Suitable plating methods include, for example, horizontal or vertical wafer plating, barrel plating, and high speed plating. A tin alloy may be deposited on a substrate by the steps of contacting the substrate with the electrolyte composition described above and passing a current through the electrolyte to deposit the tin alloy on the substrate. Any substrate that can be electrolytically plated with a metal is suitable for plating according to the present invention. Suitable substrates include, but are not limited to: copper, copper alloys, nickel, nickel alloys, nickel-iron containing materials, electronic components, plastics, semiconductor wafers such as silicon wafers, and the like. Suitable plastics include plastic laminates, such as printing wiring boards, particularly copper clad printed wiring boards. The electrolyte compositions of the present invention are particularly suitable for electroplating of electronic components, such as lead frames, semiconductor wafers, semiconductor packages, components, connectors, contacts, chip capacitors, chip resistors, printed wiring boards, and the like, with particular applicability being found in wafer interconnect bump plating applications.

The substrate may be contacted with the electrolyte composition in any manner known in the art. Typically, the substrate is placed in a bath containing the electrolyte composition of the present invention.

The current density used to plate the tin-alloy of the present invention will depend on the particular plating method. Generally, the current density will be 1 or more A/dm$^2$, more specifically from 1 to 200 A/dm$^2$, even more specifically from 2 to 30 A/dm$^2$, still more specifically from 2 to 20 A/dm$^2$, still more specifically from 2 to 10 A/dm$^2$, and still more specifically from 2 to 8 A/dm$^2$.

Typically, the tin-alloys of the present invention may be deposited at a temperature in the range of, but not limited to, 15° C. or higher, more specifically 15° to 66° C., and even more specifically 21° to 52° C., and still further specifically 23° to 49° C.

In general, the length of time a substrate remains in a plating bath containing the electrolyte compositions of the present invention is not critical. Longer times typically result in thicker deposits while shorter times typically result in thinner deposits, for a given temperature and current density. Thus, the length of time a substrate remains in a plating bath may be used to control the thickness of the resulting alloy deposit.

The electrolyte compositions of the present invention may be used to deposit tin-alloys of various compositions. For example, alloys of tin and one or more of silver, copper, bismuth, zinc, indium, or antimony typically contain 0.01 to 25 wt % of the alloying metal(s) and 75 to 99.99 wt % tin, more specifically 0.01 to 10 wt % of the alloying metal(s) and 90 to 99.99 wt % tin, or even more specifically, 0.1 to 5 wt % of the alloying metal(s) and 95 to 99.9 wt % tin, based on the weight of the alloy, as measured by either atomic adsorption spectroscopy ("AAS"), x-ray fluorescence ("XRF"), inductively coupled plasma ("ICP") or differential scanning calorimetry ("DSC"). For many applications, the eutectic composition of the particular alloy may be beneficially used. Such tin alloys are substantially free of lead and cyanides, and preferably free of lead and cyanides.

While the electrolyte compositions of the present invention can advantageously be used for a variety of applications as described above, the invention will now be described with reference to an exemplary application of interconnect bump formation for wafer-level-packaging.

The method involves providing a semiconductor die having a plurality of interconnect bump pads, forming a seed layer over the interconnect bump pads, depositing a tin-alloy interconnect bump layer over the interconnect bump pads by contacting the semiconductor die with the inventive electrolyte composition and passing a current through the electrolyte composition to deposit the tin alloy interconnect bump layer on the substrate, and reflowing the interconnect bump layer.

FIG. 1(a)–(l) illustrates in cross-section an interconnect bump on a semiconductor device at various stages of formation thereof, in accordance with the invention. More particularly, FIG. 1(a)–(f) illustrates a mushroom plating process while FIG. 1(g)–(l) illustrate an in-via plating process for forming interconnect bumps.

As shown in FIG. 1(a) and (g), the device includes a semiconductor substrate 100 on which is formed a conductive interconnect bump pad 102. While a single I/O pad is illustrated, a plurality of such I/O pads is present on the device. The semiconductor substrate 100 can be, for example, a single-crystal silicon wafer, a silicon-on-sapphire (SOS) substrate, or a silicon-on-insulator (SOI) substrate. The conductive interconnect bump pad 102 can be one or more layers of a metal, composite metal or metal alloy typically formed by physical vapor deposition (PVD) such as sputtering. Typical conductive interconnect bump pad materials include, without limitation, aluminum, copper, titanium nitride, and alloys thereof.

A passivation layer 104 is formed over the interconnect bump pads 102, and openings extending to the interconnect bump pads are formed therein by an etching process, typically by dry etching. The passivation layer 104 is typically an insulating material, for example, silicon nitride, silicon oxynitride, or a silicon oxide, such as phosphosilicate glass (PSG). Such materials can be deposited by chemical vapor deposition (CVD) processes, such as plasma enhanced CVD (PECVD).

An under bump metallization (UBM) structure 106, formed typically of a plurality of metal or metal alloy layers, is deposited over the device. The UBM acts as an adhesive layer and electrical contact base (seed layer) for the interconnect bump to be formed. The layers forming the UBM structure may be deposited by PVD, such as sputtering or evaporation, or CVD processes. Without limitations, the UBM structure may be, for example, a composite structure including in order, a bottom chrome layer, a copper layer, and an upper tin layer.

As shown in FIG. 1(b) and (h), a photoresist layer is applied to the device, followed by standard photolithographic exposure and development techniques to form a plating mask 108. The plating mask defines the size and location of the plating via 110 over the I/O pad and UBM. Without limitation, the mushroom plating process generally employs a relatively thin photoresist layer, typically from about 25 to 70 μm in thickness, while the in via plating process generally employs a relatively thick photoresist layer, typically from about 70 to 120 μm in thickness. Suitable photoresist materials are commercially available, and include, for example, Shipley BPR™-100, from Shipley Company, L.L.C., Marlborough, Mass.

As shown in FIG. 1(c) and (i), the interconnect bump material 112 is deposited on the device by an electroplating process using the above-described electroplating composition. Without limitation, suitable interconnect bump material include, for example, tin-silver, tin-copper, tin-silver-copper, tin-bismuth, and tin-silver-bismuth alloys. Such alloys may have compositions such as described above. It may be desired to use such compositions at their eutectic concentrations. The bump material is electrodeposited in the areas defined by the plating via 110. For this purpose, a horizontal or vertical wafer plating system, for example, a fountain plating system, is typically used with a direct current (DC) or pulse-plating technique. In the mushroom plating process of FIG. 1(c), the interconnect bump material completely fills the via 110, extending above and on a portion of the top surface of the plating mask. This ensures that a sufficient volume of interconnect bump material is deposited to achieve the desired ball size after reflow. In the in via plating process, the photoresist thickness is sufficiently thick such that the appropriate volume of interconnect bump material is contained within the plating mask via. A layer of copper or nickel may advantageously be electrodeposited in the plating via 110 prior to plating the interconnect bump material 112. Such a layer can act as a wettable foundation to the interconnect bump upon reflow.

With reference to FIG. 1(d) and (j), following deposition of the interconnect bump material 112, the plating mask 108 is stripped using an appropriate solvent. The UBM structure is then selectively etched using known techniques, removing all metal from the field area around and between interconnect bumps. The resulting structure is shown in FIG. 1(e) and (k).

The wafer is then optionally fluxed and is heated in a reflow oven to a temperature at which the interconnect bump material melts and flows into a truncated substantially spherical shape, as illustrated in FIG. 1(f) and (l). Suitable heating techniques are known in the art, and include, for example, infrared, conduction, and convection techniques, and combinations thereof. The reflowed interconnect bump is generally coextensive with the edges of the UBM structure. The heat treatment step can be conducted in an inert gas atmosphere or in air, with the particular process temperature and time being dependent upon the particular composition of the interconnect bump material.

The following examples are intended to further illustrate the present invention, but are not intended to limit the scope of the invention in any aspect.

EXAMPLES 1–3

Figure 2:
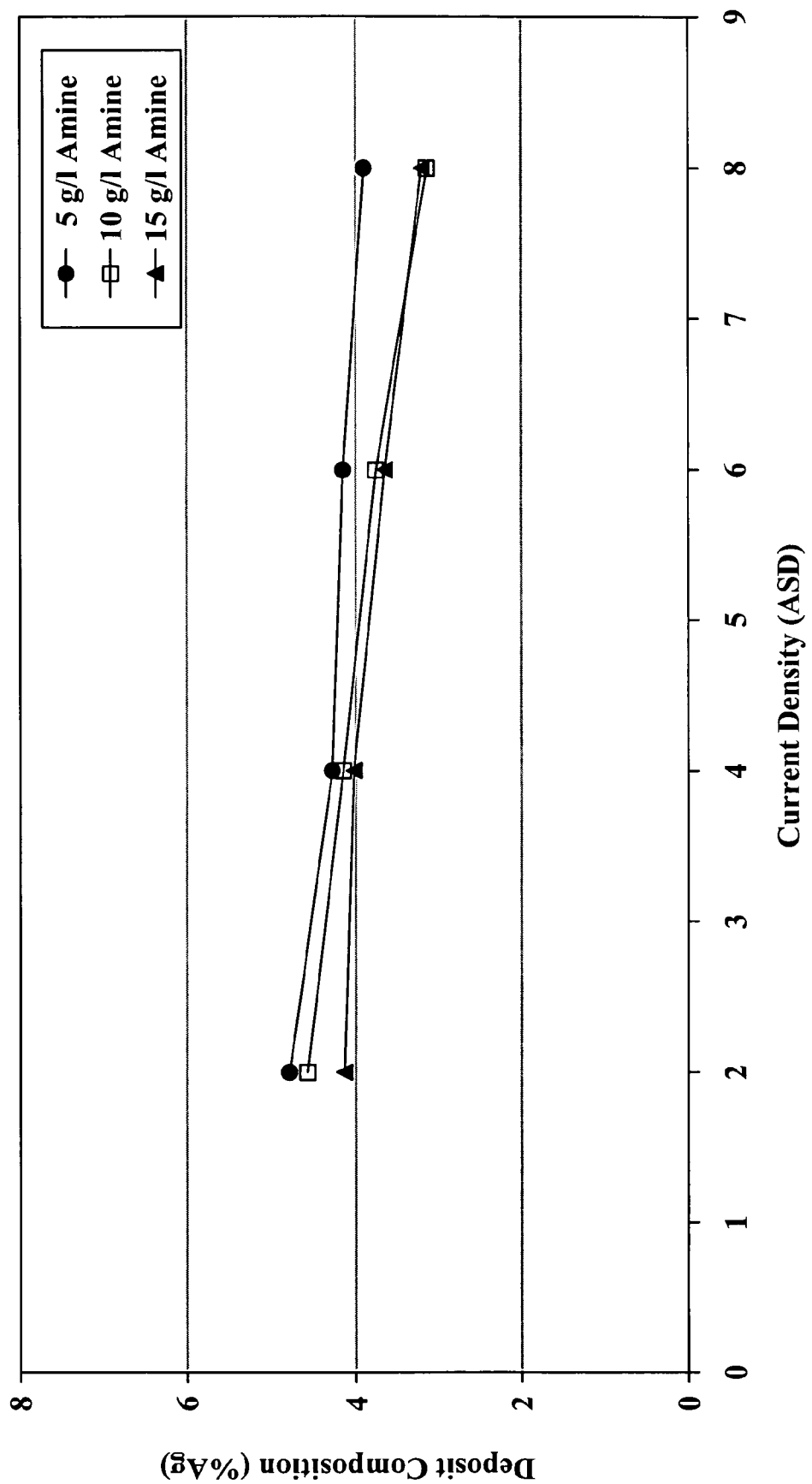
FIG. 2 is a is a graph of deposit composition versus current density for tin-silver electroplating compositions in accordance with the invention.

Electrolyte compositions were prepared by combining 60 g/L tin from tin methane sulfonate, 1.5 g/L silver from silver methane sulfonate, 50 g/L methane sulfonic acid, 15 g/L 1-allyl-2-thiourea, 1.04 g/L vanadium (IV) acetyl acetonate, tetra(2-hydroxypropyl)ethylenediamine in amounts of 5, 10 and 15 g/L, and deionized water (balance), at 30° C. Coupons of Hull steel panels were immersed in the compositions in a Hull cell and plated with a layer of tin-silver at current densities of 2, 4, 6 and 8 A/dm$^2$. The silver concentration of the resulting layer for each of the samples was measured by XRF. The results are shown in FIG. 2, which is a graph of deposit composition versus current density. FIG. 2 demonstrates that a generally uniform composition for the tin-silver deposits can be achieved over a broad current density range.

EXAMPLES 4–5, COMPARATIVE EXAMPLE 1

Electrolyte compositions were prepared by combining 40 g/L tin from tin methane sulfonate, 1 g/L silver from silver methane sulfonate, 90 g/L methane sulfonic acid, 2 g/L ethoxylated bis phenol, 4 g/L 1-allyl-2-thiourea, and deionized water (balance) at 30° C. A Hull steel panel was immersed in the composition in a Hull cell and plated with a layer of tin-silver. The silver concentration of the resulting layer at locations on the steel panel corresponding to 2, 4, 6, 8 and 10 A/dm$^2$ was measured by XRF. This procedure was repeated for electrolyte compositions in which the 1-allyl-2-thiourea was replaced with 4 g/L 1,1,3,3-tetramethyl-2-thiourea and then with 4 g/L thiourea (comparative). The results are shown in FIG. 3, which is a graph of deposit composition versus current density for the three electrolyte compositions.

Figure 3:
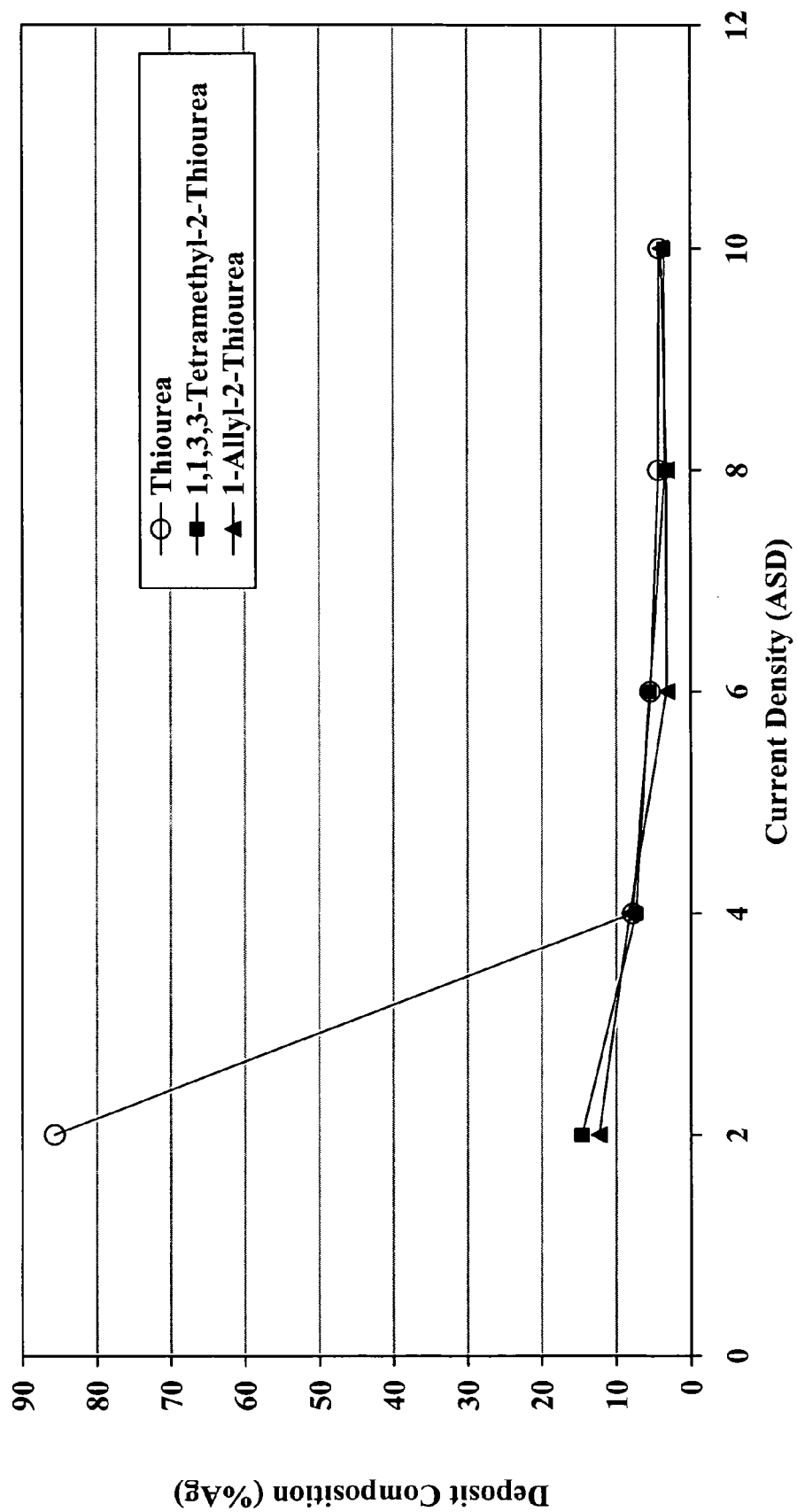
FIG. 3 is a is a graph of deposit composition versus current density for tin-silver electroplating compositions in accordance with the invention and for a comparative tin-silver electroplating composition.

As can be seen from FIG. 3, the electrolyte compositions using the thiourea derivatives, 1-allyl-2-thiourea and 1,1,3,3-tetramethyl-2-thiourea, resulted in a relatively uniform composition for the tin-silver deposits over the entire current density range of 2 to 10 A/dm$^2$. In contrast, the comparative electrolyte composition using thiourea resulted in a nonuniform composition at the lower end of the current density range tested.

EXAMPLE 6, COMPARATIVE EXAMPLE 2

Electrolyte compositions were prepared by combining 40 g/L tin from tin methane sulfonate, 1 g/L copper from copper methane sulfonate, 90 g/L methane sulfonic acid, 2 g/L ethoxylated bis phenol, 4 g/L 1-allyl-2-thiourea, and deionized water (balance), at 30° C. A Hull steel panel was immersed in the composition in a Hull cell and plated with a layer of tin-copper. The copper concentration of the resulting layer at locations on the steel panel corresponding to 2, 4, 6, 8 and 10 A/dm² was measured by XRF. This procedure was repeated for electrolyte compositions in which the 1-allyl-2-thiourea was replaced with 4 g/L thiourea (comparative). The results are shown in FIG. 4, which is a graph of deposit composition versus current density for the two electrolyte compositions.

Figure 4:
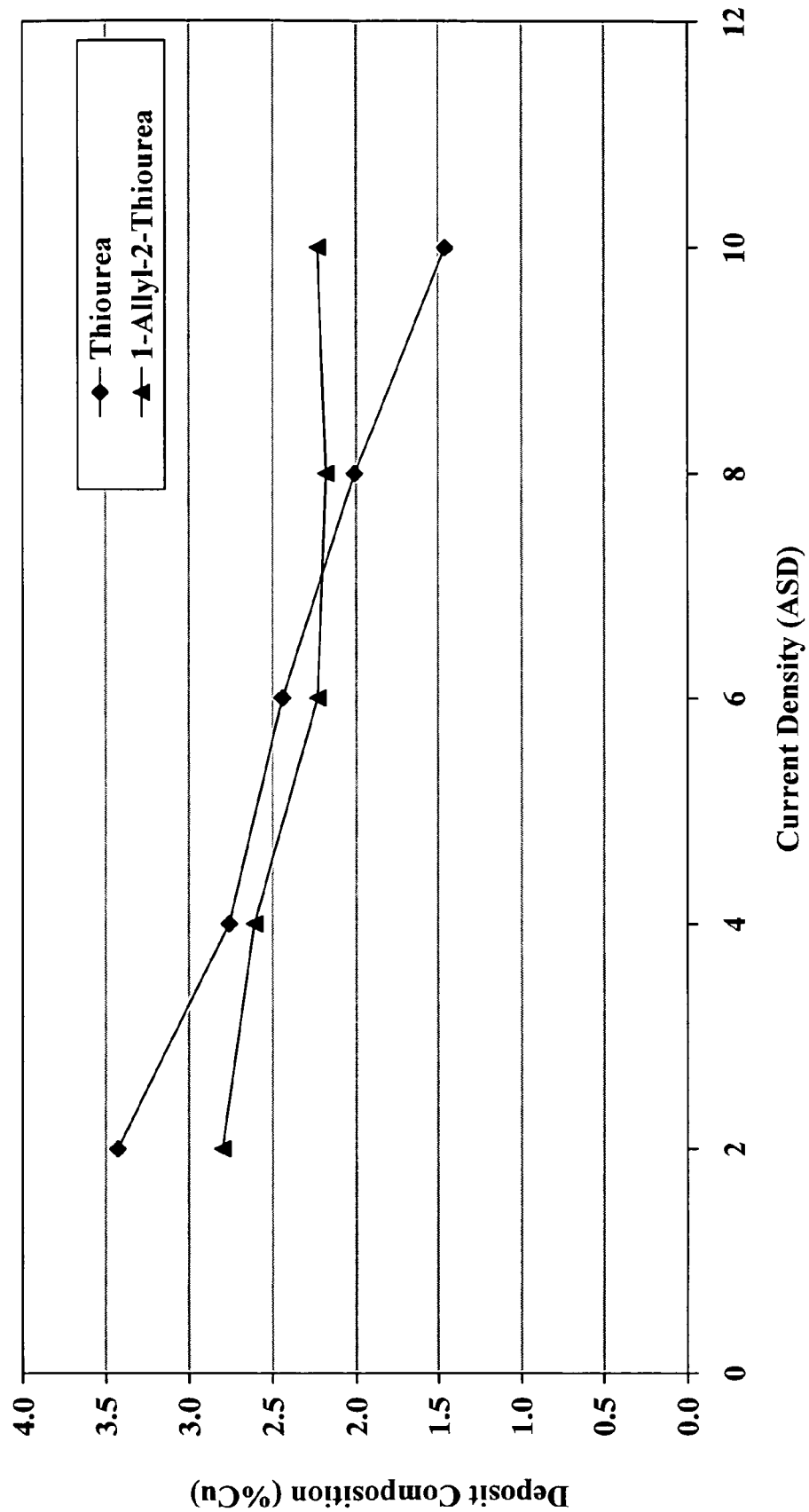
FIG. 4 is a graph of deposit composition versus current density for a tin-copper electroplating composition in accordance with the invention and for a comparative tin-copper electroplating composition.

As can be seen from FIG. 4, the electrolyte composition using the thiourea derivative, 1-allyl-2-thiourea resulted in a relatively uniform composition for the tin-copper deposits over the entire current density range of 2 to 10 A/dm². In contrast, the comparative electrolyte composition using thiourea resulted in a nonuniform composition over the current density range tested.

EXAMPLE 7, COMPARATIVE EXAMPLE 3

Electrolyte compositions were prepared by combining 40 g/L tin from tin methane sulfonate, 1 g/L bismuth from bismuth methane sulfonate, 160 g/L methane sulfonic acid, 2 g/L ethoxylated bis phenol, 4 g/L 1-allyl-2-thiourea, and deionized water (balance), at 30° C. A Hull steel panel was immersed in the composition in a Hull cell and plated with a layer of tin-bismuth. The bismuth concentration of the resulting layer at locations on the steel panel corresponding to 2, 4, 6, and 8 A/dm² was measured by XRF. This procedure was repeated for an electrolyte composition in which the 1-allyl-2-thiourea was replaced with 4 g/L thiourea (comparative). The results are shown in FIG. 5, which is a graph of deposit composition versus current density for the two electrolyte compositions.

Figure 5:
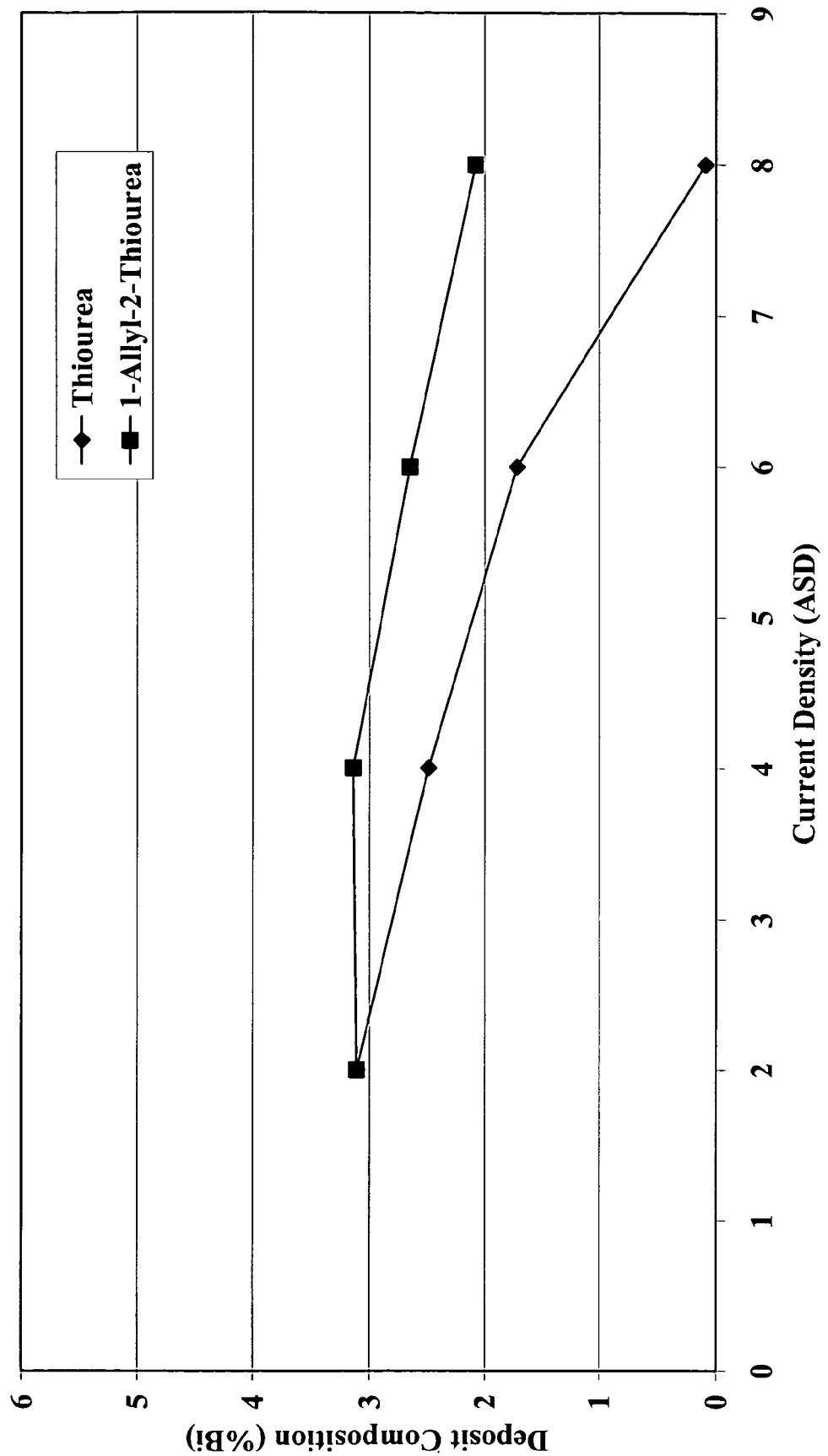
FIG. 5 is a graph of deposit composition versus current density for a tin-bismuth electroplating composition in accordance with the invention and for a comparative tin-copper electroplating composition.

As can be seen from FIG. 5, the electrolyte composition using the thiourea derivative, 1-allyl-2-thiourea, resulted in a relatively uniform composition for the tin-bismuth deposit over the entire current density range of 2 to 8 A/dm². In contrast, the comparative electrolyte composition using thiourea resulted in a nonuniform composition over the current density range tested.

EXAMPLE 8, COMPARATIVE EXAMPLE 4

Electrolyte compositions were prepared by combining 40 g/L tin from tin methane sulfonate, 1 g/L silver from silver methane sulfonate, 1 g/L copper from copper methane sulfonate, 90 g/L methane sulfonic acid, 2 g/L ethoxylated bis phenol, 4 g/L 1-allyl-2-thiourea, and deionized water (balance), at 30° C. A Hull steel panel was immersed in the composition in a Hull cell and plated with a layer of tin-silver-copper. The silver and copper concentration of the resulting layer at locations on the steel panel corresponding to 2, 4, 6, 8 and 10 A/dm² was measured by XRF. This procedure was repeated for an electrolyte composition in which the 1-allyl-2-thiourea was replaced with 4 g/L thiourea (comparative). The results are shown in FIG. 6, which is a graph of deposit composition versus current density for the two electrolyte compositions.

Figure 6:
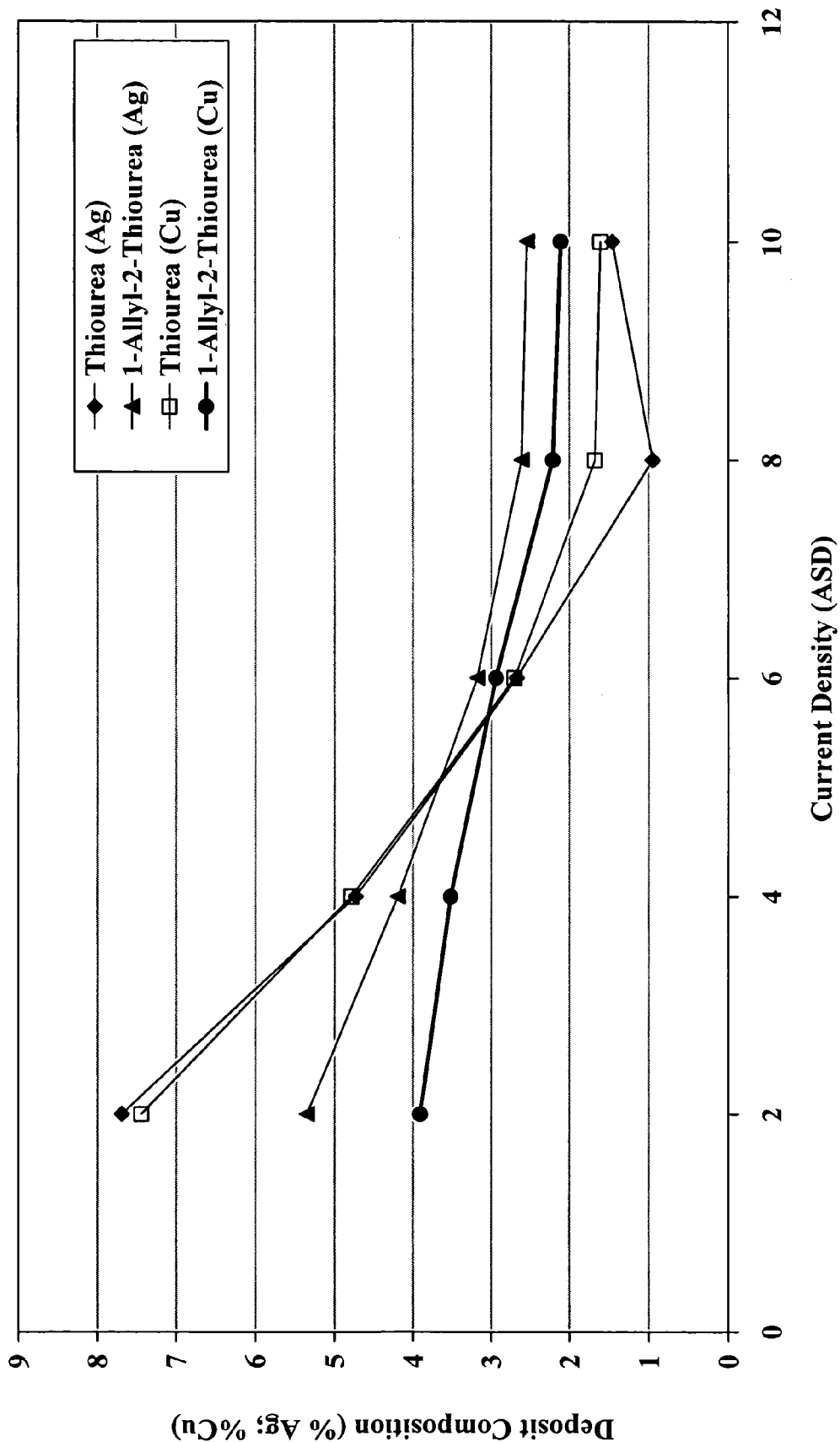
FIG. 6 is a graph of deposit composition versus current density for a tin-silver-copper electroplating composition in accordance with the invention and for a comparative tin-silver-copper electroplating composition.

As can be seen from FIG. 6, the electrolyte composition using the thiourea derivative, 1-allyl-2-thiourea, resulted in a relatively uniform composition for the tin-silver-copper deposit over the entire current density range of 2 to 10 A/dm². In contrast, the comparative electrolyte composition using thiourea resulted in a nonuniform composition over the current density range tested.

EXAMPLE 9, COMPARATIVE EXAMPLE 5

Electrolyte compositions were prepared by combining 40 g/L tin from tin methane sulfonate, 1 g/L silver from silver methane sulfonate, 1 g/L bismuth from bismuth methane sulfonate, 90 g/L methane sulfonic acid, 2 g/L ethoxylated bis phenol, 4 g/L 1-allyl-2-thiourea, and deionized water (balance), at 30° C. A Hull steel panel was immersed in the composition in a Hull cell and plated with a layer of tin-silver-bismuth. The silver and bismuth concentration of the resulting layer at locations on the steel panel corresponding to 2, 4, 6, 8 and 10 A/dm² was measured by XRF. This procedure was repeated for an electrolyte composition in which the 1-allyl-2-thiourea was replaced with 4 g/L thiourea (comparative). The results are shown in FIG. 7, which is a graph of deposit composition versus current density for the two electrolyte compositions.

Figure 7:
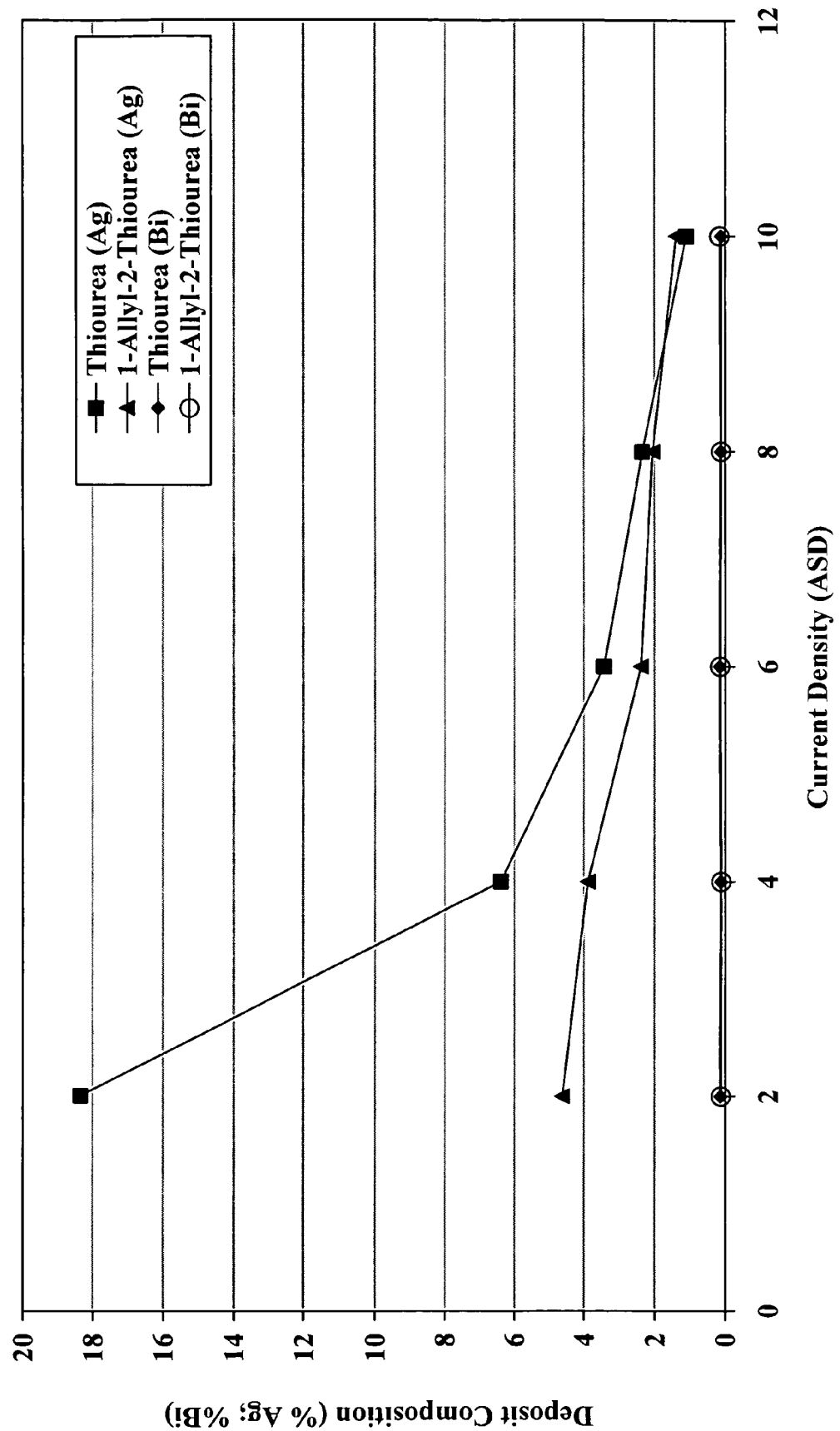
FIG. 7 is a graph of deposit composition versus current density for a tin-silver-bismuth electroplating composition in accordance with the invention and for a comparative tin-silver-bismuth electroplating composition.

As can be seen from FIG. 7, the electrolyte composition using the thiourea derivative, 1-allyl-2-thiourea, resulted in a relatively uniform composition for the tin-silver-bismuth deposit over the entire current density range of 2 to 10 A/dm². In contrast, the electrolyte composition using thiourea resulted in a nonuniform composition over the current density range tested.

EXAMPLES 10–11, COMPARATIVE EXAMPLE 6

Electrolyte compositions were prepared by combining 40 g/L tin from tin methane sulfonate, 1 g/L silver from silver methane sulfonate, 90 g/L methane sulfonic acid, 2 g/L tetra(2-hydroxypropyl)ethylenediamine, 4 g/L 1-allyl-2-thiourea, and deionized water (balance), at 30° C. A Hull steel panel was immersed in the composition in a Hull cell and plated with a layer of tin-silver. The silver concentration of the resulting layer at locations on the steel panel corresponding to 2, 4, 6, and 8 A/dm² was measured by XRF. This procedure was repeated for electrolyte compositions in which the 1-allyl-2-thiourea was replaced with 4 g/L 1,1,3,3-tetramethyl-2-thiourea and then with 4 g/L thiourea (comparative). The results are shown in FIG. 8, which is a graph of deposit composition versus current density for the three electrolyte compositions.

Figure 8:
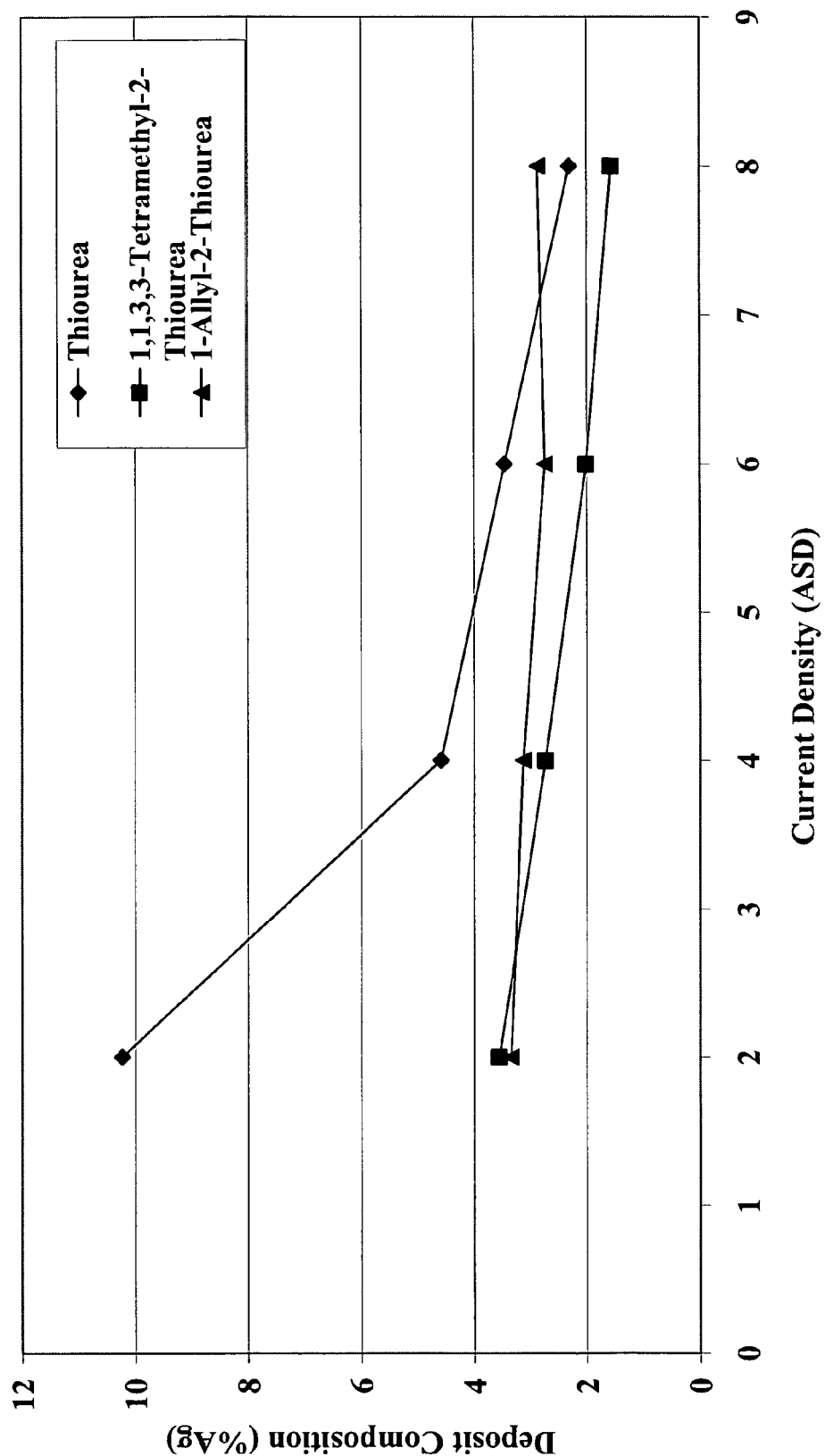
FIG. 8 is a graph of deposit composition versus current density for a tin-silver electroplating composition in accordance with the invention and for a comparative tin-silver electroplating composition.

As can be seen from FIG. 8, the electrolyte compositions using the thiourea derivatives, 1-allyl-2-thiourea and 1,1,3,3-tetramethyl-2-thiourea, resulted in a relatively uniform composition for the tin-silver deposits over the entire current density range of 2 to 8 A/dm². In contrast, the electrolyte composition using thiourea resulted in a nonuniform composition over the current density range tested.

EXAMPLES 12–13, COMPARATIVE EXAMPLE 7

Electrolyte compositions were prepared by combining 40 g/L tin from tin methane sulfonate, 1 g/L copper from copper methane sulfonate, 90 g/L methane sulfonic acid, 2 g/L tetra(2-hydroxypropyl)ethylenediamine, 4 g/L 1-allyl-2-thiourea, and deionized water (balance), at 30° C. A Hull steel panel was immersed in the composition in a Hull cell and plated with a layer of tin-copper. The copper concentration of the resulting layer at locations on the steel panel corresponding to 2, 4, 6, and 8 A/dm² was measured by XRF. This procedure was repeated for electrolyte compositions in which the 1-allyl-2-thiourea was replaced with 4 g/L 1,1,3,3-tetramethyl-2-thiourea and then with 4 g/L thiourea (comparative). The results are shown in FIG. 9, which is a graph of deposit composition versus current density for the three electrolyte compositions.

Figure 9:
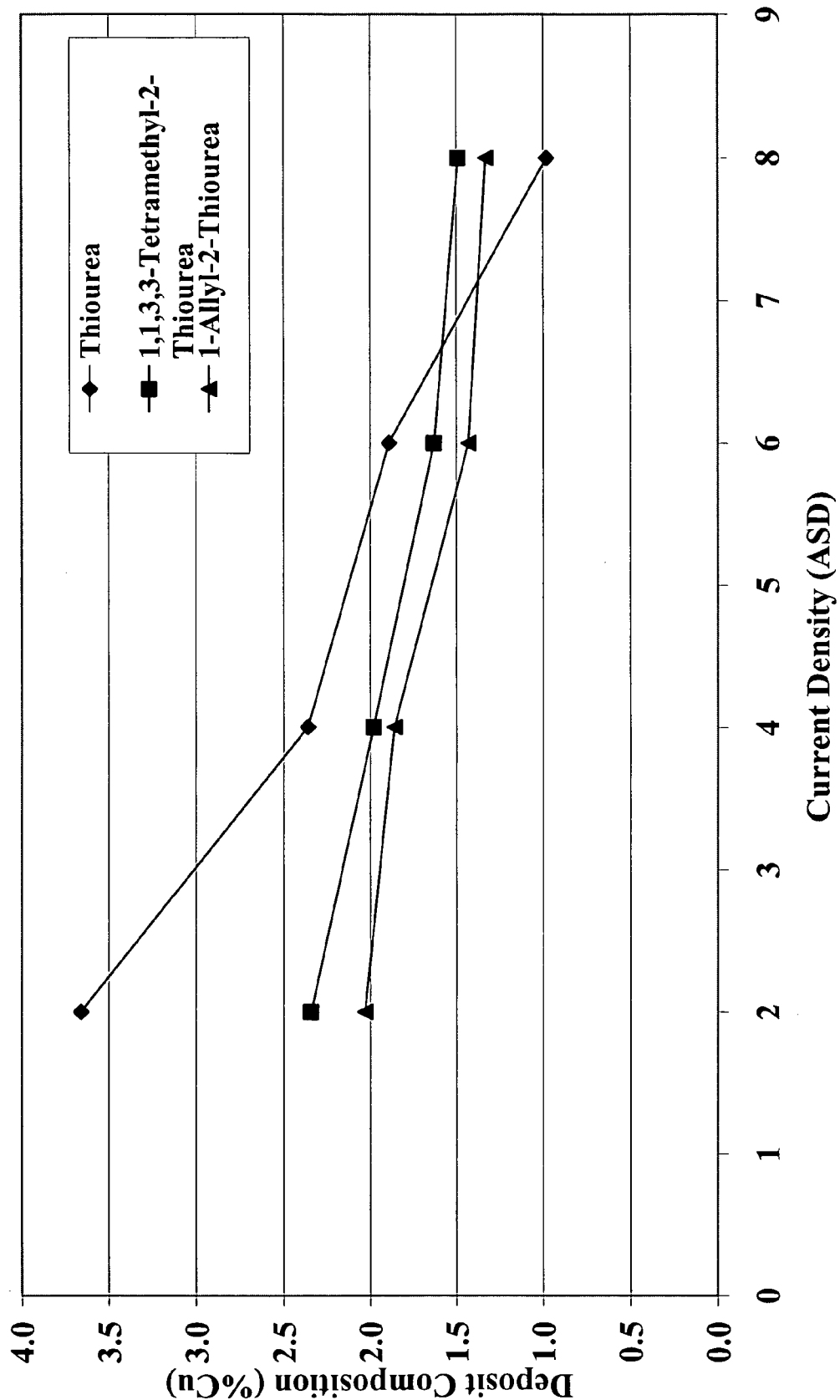
FIG. 9 is a graph of deposit composition versus current density for a tin-copper electroplating composition in accordance with the invention and for a comparative tin-copper electroplating composition.

As can be seen from FIG. 9, the electrolyte compositions using the thiourea derivatives, 1-allyl-2-thiourea and 1,1,3, 3-tetramethyl-2-thiourea, resulted in a relatively uniform composition for the tin-copper deposits over the current density range of 2 to 8 A/dm$^2$. In contrast, the electrolyte composition using thiourea resulted in a nonuniform composition over the current density range tested.

EXAMPLES 14–15, COMPARATIVE EXAMPLE 8

Electrolyte compositions were prepared by combining 40 g/L tin from tin methane sulfonate, 1 g/L bismuth from bismuth methane sulfonate, 90 g/L methane sulfonic acid, 2 g/L tetra(2-hydroxypropyl)ethylenediamine, 4 g/L 1-allyl-2-thiourea, and deionized water (balance), at 30° C. A Hull steel panel was immersed in the composition in a Hull cell and plated with a layer of tin-bismuth. The bismuth concentration of the resulting layer at locations on the steel panel corresponding to 2, 4, 6, and 8 A/dm$^2$ was measured by XRF. This procedure was repeated for electrolyte compositions in which the 1-allyl-2-thiourea was replaced with 4 g/L 1,1,3,3-tetramethyl-2-thiourea and then with 4 g/L thiourea (comparative). The results are shown in FIG. 10, which is a graph of deposit composition versus current density for the three electrolyte compositions.

Figure 10:
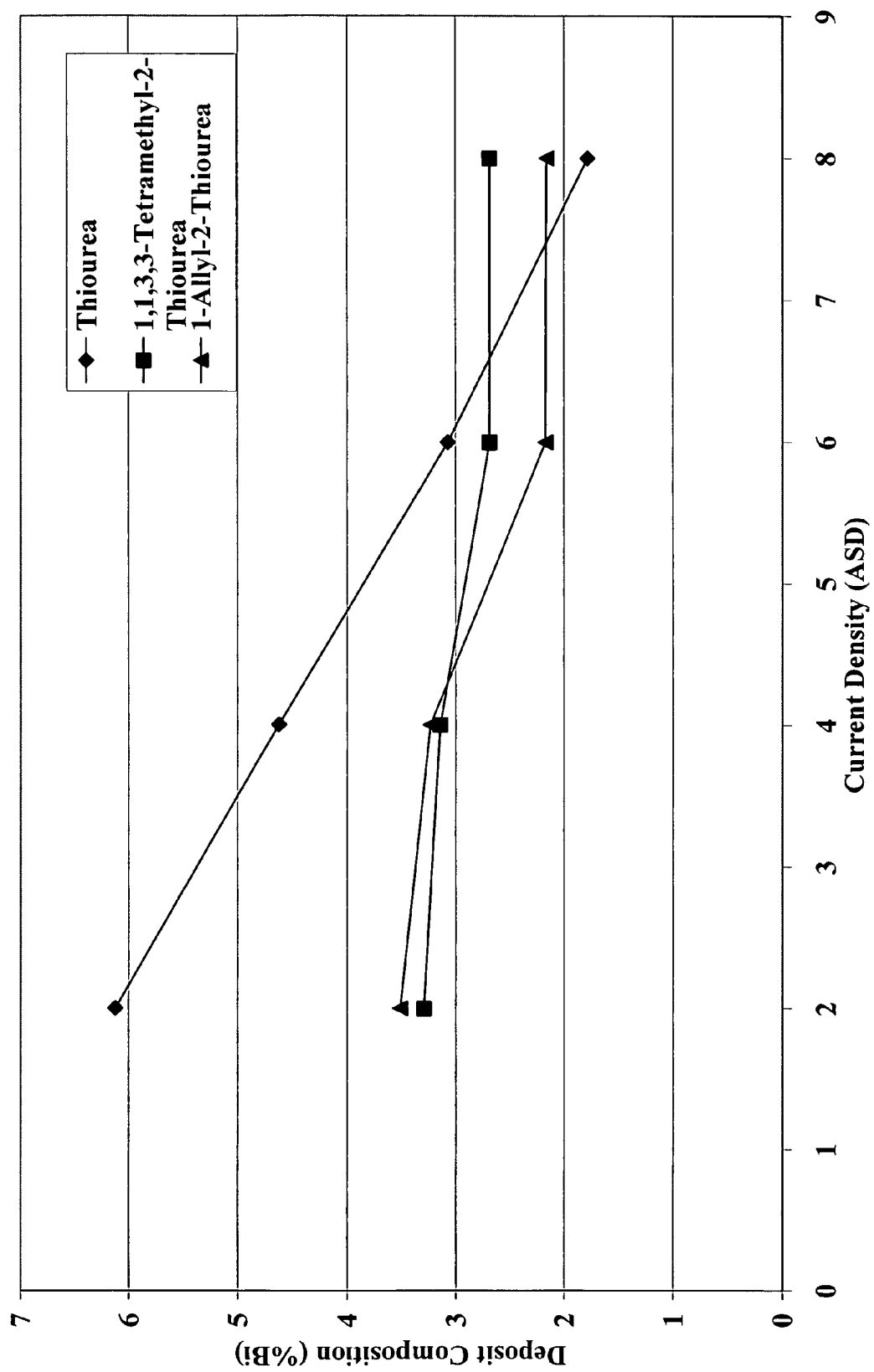
FIG. 10 is a graph of deposit composition versus current density for a tin-bismuth electroplating composition in accordance with the invention and for a comparative tin-bismuth electroplating composition.

As can be seen from FIG. 10, the electrolyte compositions using the thiourea derivatives, 1-allyl-2-thiourea and 1,1,3,3-tetramethyl-2-thiourea, resulted in a relatively uniform composition for the tin-bismuth deposits over the current density range of 2 to 8 A/dm$^2$. In contrast, the electrolyte composition using thiourea resulted in a nonuniform composition over the current density range tested.

EXAMPLE 16

Figure 11:
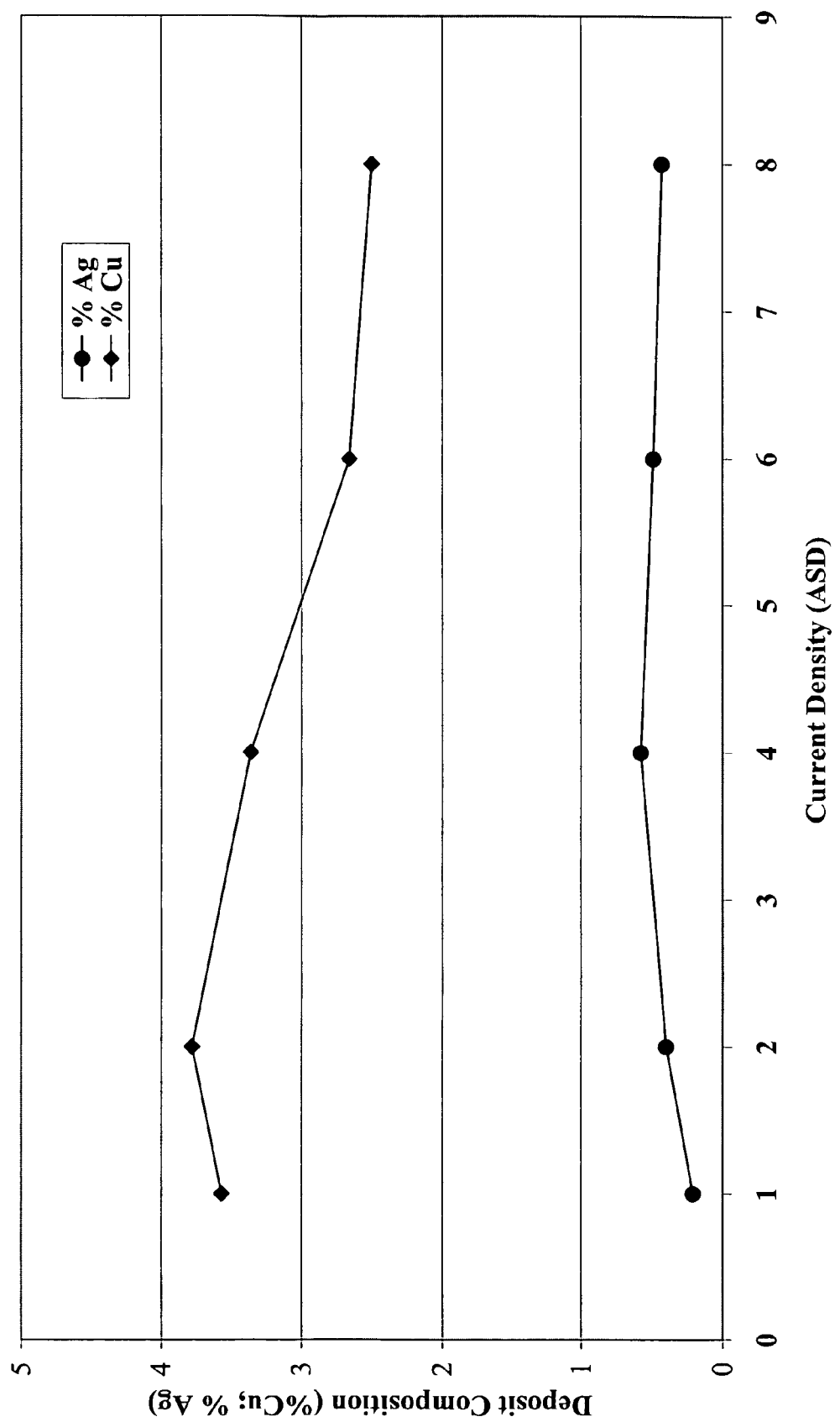
FIG. 11 is a is a graph of deposit composition versus current density for a tin-silver-copper electroplating composition in accordance with the invention.

An electrolyte composition was prepared by combining 60 g/L tin from tin methane sulfonate, 1.5 g/L silver from silver methane sulfonate, 0.5 g/L copper from copper methane sulfonate, 110 g/L methane sulfonic acid, 1 g/L vanadium (IV) acetal acetonate, 10 g/L tetra(2-hydroxypropyl)ethylenediamine, 15 g/L 1-allyl-2-thiourea, and deionized water (balance), at 25° C. A Hull steel panel was immersed in the composition in a Hull cell and plated with a layer of tin-silver-copper. The tin, copper and silver concentration of the resulting layer at locations on the steel panel corresponding to 1, 2, 4, 6, and 8 A/dm$^2$ was measured by XRF. The results are shown in FIG. 11. As can be seen from FIG. 11, a tin-silver-copper film having good uniformity was obtained over the entire current density range tested.

EXAMPLE 17

An electrolyte composition was prepared by combining 60 g/L tin from tin methane sulfonate, 0.5 g/L silver from silver methane sulfonate, 0.3 g/L copper from copper methane sulfonate, 150 g/L methane sulfonic acid, 1 g/L vanadium (IV) acetyl acetonate, 5 g/L tetra(2-hydroxypropyl)ethylenediamine, 7 g/L 1-allyl-2-thiourea, and deionized water (balance), at 25° C. The composition was used to plate a tin-silver-copper layer on a rotating steel cylinder at 3 A/dm$^2$. The tin, copper and silver concentration of the resulting layer was measured by XRF and the melting point of the deposit was determined. The composition of the deposit was 95.56 wt % tin, 3.56 wt % silver, and 0.88 wt % copper, and the melting point was 217.48° C.

EXAMPLE 18

Electrolyte compositions were prepared by combining 20 g/L tin from tin methane sulfonate, 0.5 g/l silver from silver methane sulfonate, 50 g/L methane sulfonic acid, 8 g/L 1-allyl-2-thiourea, 5 g/L carboxymethylated polyethyleneimine (MW 5000), and deionized water (balance), at 30° C. Coupons of Hull steel panels and copper-seeded wafers were immersed in the composition in a Hull cell and plated with a layer of tin-silver at current densities of 2, 3, 5, 7, and 9 A/dm$^2$. The resulting deposits were visually observed and the silver concentration of the resulting deposits for each of the samples was measured by XRF. The deposits were found to be smooth and uniform by visual observation, and were eutectic or near-eutectic compositions.

EXAMPLE 19

The procedures of Example 18 were repeated except the electrolyte composition was formed by combining 60 g/L tin from tin methane sulfonate, 0.5 g/l silver from silver methane sulfonate, 130 g/L methane sulfonic acid, 7 g/L 1-allyl-2-thiourea, 5 g/L tetra(2-hydroxypropyl)ethylenediamine, and deionized water (balance), at 30° C. The deposits were found to be smooth and uniform by visual observation, and were eutectic or near-eutectic compositions.

EXAMPLE 20

The procedures of Example 18 were repeated except the electrolyte composition was formed by combining 40 g/L tin from tin methane sulfonate, 1 g/l silver from silver methane sulfonate, 90 g/L methane sulfonic acid, 5 g/L 1-allyl-2-thiourea, 1 g/L polyethyleneimine (MW 50,000), and deionized water (balance), at 30° C. The deposits were found to be smooth and uniform by visual observation, and were eutectic or near-eutectic compositions.

EXAMPLE 21

The procedures of Example 18 were repeated except the electrolyte composition was formed by combining 20 g/L tin from tin methane sulfonate, 0.5 g/l silver from silver methane sulfonate, 160 g/L methane sulfonic acid, 3 g/L 1-allyl-2-thiourea, 4 g/L polyethyleneimine (MW 2000), and deionized water (balance), at 30° C. The deposits were found to be smooth and uniform by visual observation, and were eutectic or near-eutectic compositions.

EXAMPLES 22–23, COMPARATIVE EXAMPLE 9

Figure 12:
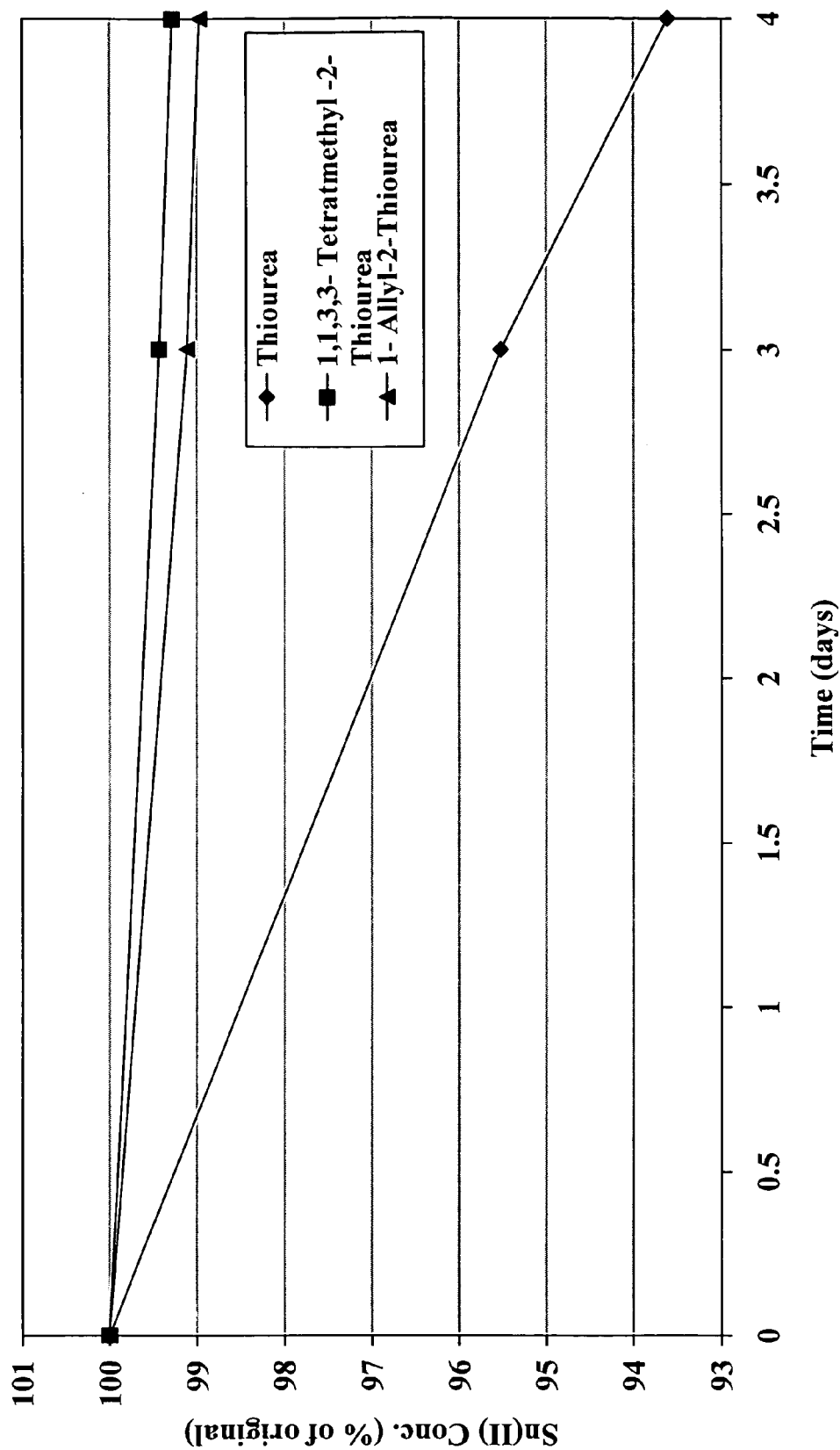
FIG. 12 is a graph of tin (II) concentration versus time for tin-silver electroplating compositions in accordance with the invention and for a comparative tin-silver electroplating composition.

An electrolyte composition was prepared by combining 40 g/L tin from tin methane sulfonate, 1 g/L silver from silver methane sulfonate, 90 g/L methane sulfonic acid, 2 g/L ethoxylated bis phenol, 4 g/L 1-allyl-2-thiourea, and deionized water (balance), at 30° C. Two additional electrolyte compositions were prepared as above, except the 1-allyl-2-thiourea was replaced with 4 g/L 1,1,3,3-tetramethyl-2-thiourea and with 4 g/L thiourea (comparative). The effect of the different complexing agents on the stability of a tin-silver bath during idle time was tested. 250 ml of each bath were maintained at room temperature and the concentration of tin (II) was analyzed over a period of four days. The results are shown in FIG. 12, which is a graph of tin (II) concentration versus time. As shown by FIG. 12, the tin (II) concentration was reduced by 1 wt % or less over four days for the compositions that included the thiourea derivatives. The tin (II) concentration in the composition containing thiourea was reduced by more than 6 wt %. Thus, the thiourea derivative-containing compositions exhibited superior antioxidant properties than the thiourea-containing composition.

EXAMPLE 24

An 8-inch silicon wafer with a 1500 Å thick copper seed layer was coated with a dry film resist to a thickness of 25 μm. The resist was patterned using a photomask to form cylindrical vias 100 μm in diameter. An electrolyte composition was prepared by combining 60 g/L tin from tin methane sulfonate, 0.5 g/L silver from silver methane sulfonate, 140 g/l methane sulfonic acid, 15 g/L 1-allyl-2-thiourea, 10 g/l N,N,N',N'-tetrakis (2-hydroxypropyl)ethylenediamine, 0.2 g/l vanadium (IV) acetyl acetonate, and deionized water (balance), at 25° C. The wafer was pre-dipped for 30 seconds in deionized water and was then electroplated in a fountain-type plating system with the electrolyte composition at a current density of 8 A/dm$^2$ for 5 minutes, 20 rpm wafer rotation, and 5 GPM electrolyte flow rate. Tin-silver deposits 25 μm in thickness were formed within the vias. The resist was removed from the wafer by rinsing in acetone and the exposed copper seed layer was removed by chemical etching using Shipley Cuproetch™ BP etching solution.

The composition of the deposited bumps was determined by XRF measurement to be 3.5% silver±0.5%. Through visual observation, scanning electron microscopy (SEM) and analysis of the cross-sectioned bumps, it was determined that the bumps had smooth surfaces and void-free.

EXAMPLE 25

An 8-inch silicon wafer with a 1500 Å thick copper seed layer was coated with BPR 100resist to a thickness of 100 μm. The resist was patterned using a photomask to form cylindrical vias 100 μm in diameter. An electrolyte composition was prepared by combining 60 g/L tin from tin methane sulfonate, 0.5 g/L silver from silver methane sulfonate, 50 g/L methane sulfonic acid, 15 g/L 1-allyl-2-thiourea, 10 g/l N,N,N',N'-tetrakis (2-hydroxypropyl)ethylenediamine, 1.04 g/l vanadium (IV) acetyl acetonate, and deionized water (balance). The wafer was dipped for 30 seconds in deionized water and was then electroplated in a vertical-type plating system with the electrolyte composition at a current density of 8 A/dm$^2$ for 25 minutes at 25° C. Tin-silver deposits of 95 μm in thickness were formed within the vias. The resist was removed from the wafer by rinsing in BPR Stripper and the exposed copper seed layer was removed by chemical etching using Shipley Cuproetch BP etching solution.

The composition of the deposited bumps was determined by XRF measurement to be 3.5% silver±0.5%. Through visual observation, scanning electron microscopy (SEM) and analysis of the cross-sectioned bumps, it was determined that the bumps had smooth surfaces and void-free.

While the invention has been described in detail with reference to specific embodiments thereof, it will be apparent to one skilled in the art that various changes and modifications can be made, and equivalents employed, without departing from the scope of the claims.

What is claimed is:

1. An electrolyte composition for depositing a tin alloy on a substrate, comprising tin ions, ions of alloying metals silver and copper or silver and bismuth, the ions of the alloying metals range from 0.01 g/L to 10 g/L, one or more multivalent compounds based on the elements vanadium, niobium, tantalum, titanium, zirconium and tungsten, an acid, a thiourea derivative, and an additive selected from alkanol amines, polyethylene imines, alkoxylated aromatic alcohols, and combinations thereof.

2. The composition of claim 1, wherein the thiourea derivative comprises 1-allyl-2-thiourea or 1,1,3,3-tetramethyl-2-thiourea.

3. The composition of claim 1, wherein the additive comprises an alkanol amine.

4. The composition of claim 1, wherein the additive comprises a polyethylene imine.

5. The composition of claim 1, wherein the additive comprises an alkoxylated aromatic alcohol.

6. The composition of claim 1, further comprising an antioxidant compound.

7. A method of depositing a tin alloy on a substrate, comprising contacting the substrate with the electrolyte composition of claim 1 and passing a current through the electrolyte composition to deposit the tin alloy on the substrate.

8. The method of claim 7, wherein the substrate is an electronic component selected from the group consisting of lead frames, semiconductor wafers, semiconductor packages, components, connectors, contacts, chip capacitors, chip resistors, and printed wiring boards.

9. The method of claim 7, wherein the ions of one or more alloying metals are selected from the group consisting of silver ions, copper ions, bismuth ions, and combinations thereof.

10. The method of claim 8, wherein the ions of one or more alloying metals comprise silver ions.

11. The method of claim 7, wherein the thiourea derivative comprises 1-allyl-2-thiourea or 1,1,3,3-tetramethyl-2-thiourea.

12. A method of forming an interconnect bump on a semiconductor device, comprising:
    (a) providing a semiconductor die having a plurality of interconnect bump pads;
    (b) forming a seed layer over the interconnect bump pads;
    (c) depositing a tin-alloy interconnect bump layer over the interconnect bump pads by contacting the semiconductor die with the electrolyte composition comprising tin ions, ions of one or more alloying metals, an acid, a thiourea derivative, and an additive selected from alkanol amines, polyethylene imines, alkoxylated aromatic alcohols and combinations thereof, and passing a current through the electrolyte composition to deposit the tin alloy interconnect bump layer on the substrate; and
    (d) reflowing the interconnect bump layer.

13. The method of claim 12, wherein the ions of one or more alloying metals are selected from the group consisting of silver ions, copper ions, bismuth ions, and combinations thereof.

14. The method of claim 13, wherein the ions of one or more alloying metals comprise silver ions.

15. The method of claim 14, wherein the ions of one or more alloying metals further comprise copper or bismuth ions.

16. The method of claim 12, wherein the thiourea derivative comprises 1-allyl-2-thiourea or 1,1,3,3-tetramethyl-2-thiourea.

17. The method of claim 12, wherein the additive comprises a polyethylene imine.

* * * * *